(12) United States Patent
Shpantzer et al.

(10) Patent No.: US 8,041,224 B2
(45) Date of Patent: Oct. 18, 2011

(54) OPTICAL FREQUENCY DIVISION MULTIPLEXED COMMUNICATIONS OVER THE HORIZON

(75) Inventors: Isaac Shpantzer, Bethesda, MD (US); Jacob Khurgin, Baltimore, MD (US)

(73) Assignee: CeLight, Inc., Silver Spring, MD (US)

( * ) Notice: Subject to any disclaimer, the term of this patent is extended or adjusted under 35 U.S.C. 154(b) by 724 days.

(21) Appl. No.: 12/137,352

(22) Filed: Jun. 11, 2008

(65) Prior Publication Data

US 2008/0310847 A1    Dec. 18, 2008

Related U.S. Application Data

(63) Continuation-in-part of application No. 11/763,130, filed on Jun. 14, 2007, now abandoned, and a continuation-in-part of application No. 12/045,765, filed on Mar. 11, 2008.

(51) Int. Cl.
*H04B 10/00*    (2006.01)
(52) U.S. Cl. .......................... 398/118; 398/115; 398/140
(58) Field of Classification Search .................. 398/118, 398/140, 141, 182, 183, 202, 115, 130
See application file for complete search history.

(56) References Cited

U.S. PATENT DOCUMENTS

| 7,826,752 | B1 * | 11/2010 | Zanoni et al. | 398/205 |
| 2005/0271387 | A1 * | 12/2005 | Kee et al. | 398/140 |

\* cited by examiner

*Primary Examiner* — M. R. Sedighian
(74) *Attorney, Agent, or Firm* — Nadya Reingand

(57) ABSTRACT

A non-line of sight (NLOS) communications system and method are provided that implement orthogonal frequency, division multiplexing. A data generator produces a digital data stream, which is converted into M parallel frequency sub-carrier digital data streams (where M is an integer), each sub-carrier is encoded with data and an Inverse Fast Fourier Transform operation is applied, and an output signal is converted to an analog signal, which is imposed onto an optical beam generated by a light source. The beam is transmitted skywards at an elevation angle above the horizon in at least one direction. The beam is scattered due to Mie and Raleigh effects, forming a scattered waveform. At least a part of the scattered waveform is received by a receiver outputting an electrical signal, which enters a DSP unit. The DSP unit digitizes the electrical signal, performs Fourier transformation and recovers data from M sub-carrier signals.

19 Claims, 10 Drawing Sheets

(a)

(b)

(c)

a)  b)

OPTICAL FREQUENCY DIVISION MULTIPLEXED COMMUNICATIONS OVER THE HORIZON

CROSS-REFERENCE TO RELATED APPLICATIONS

The present invention is a continuation-in-part of U.S. Ser. No. 11/763,130 filed Jun. 14, 2007, now abandoned and U.S. Ser. No. 12/045,765 filed Mar. 11, 2008, which are fully incorporated herein by reference.

FIELD OF INVENTION

This invention relates generally to the systems and methods for free-space optical communications, and more particularly to non-line of sight (NLOS) communications for military and civilian applications. This type of communications can provide a robust covert communication link where it is of vital importance such as military operations in urban terrain. The invention also provides an optical communication to be used as a "last mile" solution for triple play (internet, high definition TV, voice) access.

BACKGROUND OF THE INVENTION

U.S. Pat. No. 5,301,051 by Geller discloses a covert communication system that uses ultraviolet light as a medium for communication. Suitable wavelengths are chosen by examining atmospheric penetration, attenuation by clouds, presence of interfering sources, and ease of generation and detection.

It is well known that atmospheric gases such as ozone and oxygen strongly absorb light in the spectral range between 200 and 280 nm. It is called "solar blind" region of spectrum. It is beneficial to create a free-space communication link operating in this range since solar radiation will not interfere with the data transmission. Non-line of sight communication is based on the light scattering in atmosphere and detecting of at least some portion of the scattered light. Raleigh theory indicates a strong wavelength dependence of the scattering ($\sim\lambda^{-4}$) which means that blue light is scattered much more than red light. It is advantageous to use blue or UV light in NLOS communications since more light can be collected.

An optical communications transceiver of U.S. Pat. No. 6,137,609 comprises a transmitter that sends out the same information simultaneously in two channels with different wavelengths and a receiver for detecting and comparing the received data. Additional reliability of the communications is achieved by the transmission doubling.

Traditionally photomultipliers are used for UV light detection. Recently developed low noise high sensitive avalanche photodiodes are compatible with the photomultiplier in their characteristics while providing setup compactness. US patent application No. 20050098844, which addresses manufacturing of such detectors, is incorporated herein by reference.

There is still a need for improved communications system architecture to enhance detector sensitivity, information capacity and overall system reliability of non-line of sight UV optical communications.

SUMMARY OF THE INVENTION

The system and method are disclosed for non-line of sight optical communications with improved capacity, sensitivity and reliability. The sensitivity improvement is achieved by implementation of novel system architecture.

In the preferred embodiment the system operates as follows. A data generator produces a digital data stream, which is converted into M parallel frequency sub-carrier digital data streams (where M is an integer), each sub-carrier is encoded with data, then an Inverse Fast Fourier Transform operation is applied to all sub-carrier data streams, and an output signal is converted to an analog signal in a D/A converter. This analog signal is imposed onto an optical beam generated by a light source. A beam forming unit transmits the beam with imposed data skywards at an elevation angle above the horizon in at least one direction. The beam is scattered due to Mie and Raleigh effects inside a free-space volume along the beam transmission path, forming a scattered waveform. At least a part of the scattered waveform is received by a receiver outputting an electrical signal; the electrical signal enters a digital signal processing unit, the DSP unit digitizes the electrical signal, performs Fourier transformation and recovers data from M sub-carrier signals.

In the preferred embodiment the receiver includes a two-dimensional matrix of photodetectors and a two-dimensional system of microlenses to focus the scattered waveforms on the photodetectors. The optical system forms an image of the free-space volume in the plane of photodetectors, and the image is larger than one photodetector, and the DSP unit processes signals from all photodetectors, on which the image of the free-space volume is projected. The photodetector is an InGaN/GaN devices and the synchronization unit is integrated Si circuitry.

In the preferred embodiment the system transmits up to 1 Gb/s data in one optical wavelength/this data stream is encoded in M digital sub-carriers, each having capacity from 10 to 100 Mb/s.

In one of the embodiment the system operates in solar blind wavelength range from 200 nm to 280 nm. The system can operate at multiple wavelengths.

Yet another object o the present invention is a method for optical communications, comprising: emitting an initial light beam; converting a digital data stream into M parallel sub-carrier data streams, where M is integer, encoding each sub-carrier with amplitude modulated data, applying an Inverse Fast Fourier Transform operation, and converting to an analog signal in a D/A converter; modulating the initial light beam with the analog signal; directing the beam with data skywards; scattering the beam with data along its transmission path and forming a scattered light; receiving at least a first portion of the scattered light on a first photodetector, digitizing a first signal from the first photodetector, performing Fourier transformation to it and recovering data from M sub-carrier signals.

In another embodiment of the present invention a non-line of sight communications system is disclosed that transmits information in two directions each having its azimuth and elevation angle. The information transmission in each direction can be a Wavelength Division Multiplexed (WDM) transmission, where each wavelength represents a separate information channel.

DETAILED DESCRIPTION OF THE PREFERRED EMBODIMENT

Figure 1:
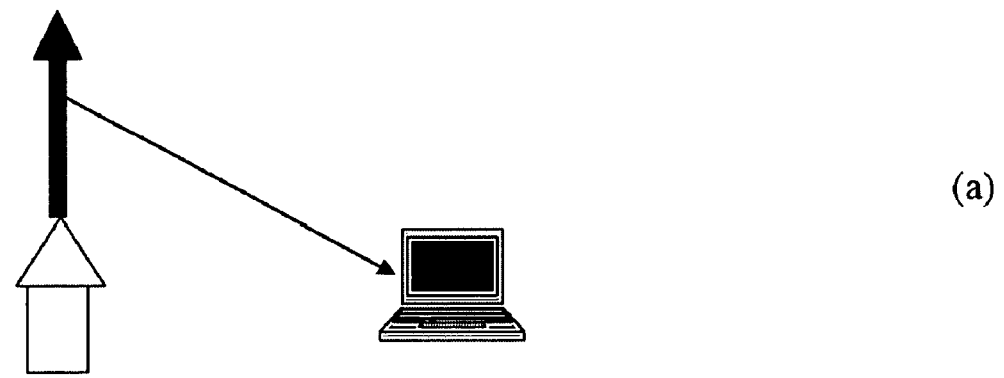
FIG. 1. A non-line of sight communications system link configurations: (*a*) vertical transmitting beam, (*b*) multiple transmitting beams with various azimuth and elevation angles, (*c*) horizontal transmitting beam.
Figure 1:
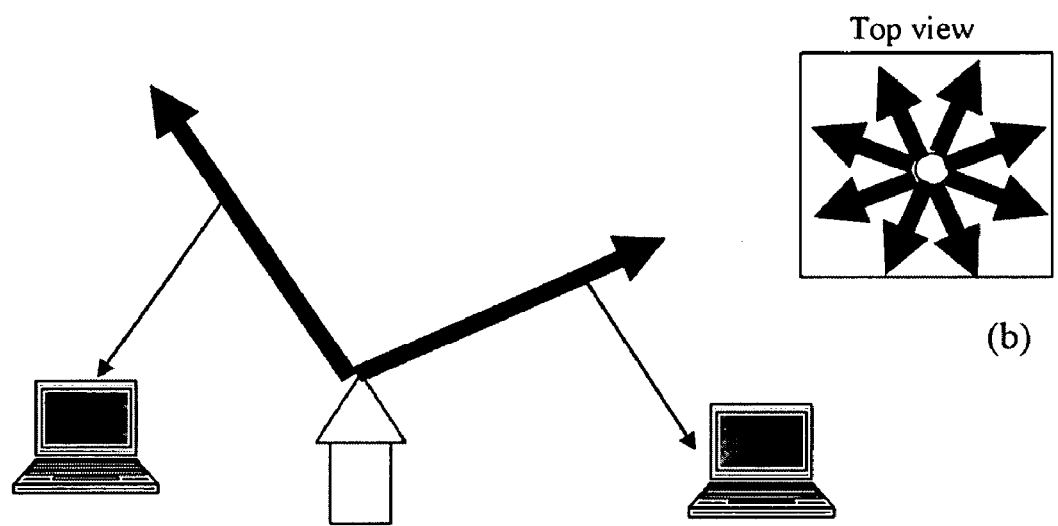
Figure 1:
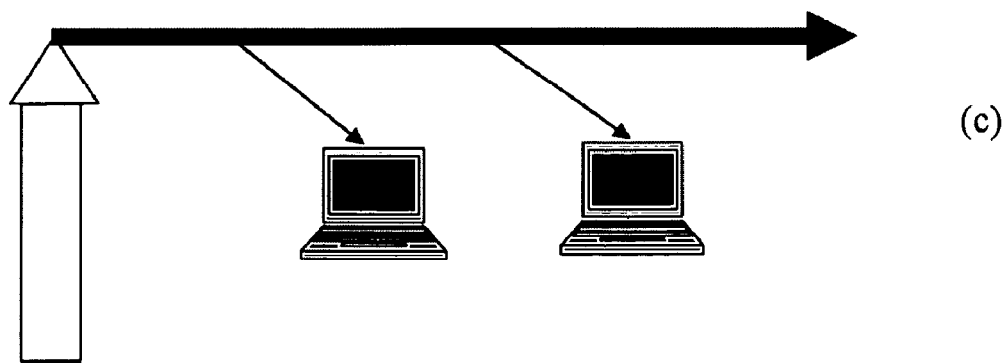

FIG. 1 illustrates the basic concept of the non-line of sight communications. Unlike point-to-point free-space optical systems requiring direct line of site between transmitter and receiver, in NLOS the modulated laser beam is projected skyward as depicted in FIG. 1, either directly up (FIG. 1(a)) or at a certain angle above the horizon and in the general direction of the receiver(s). While propagating through the atmosphere, some of the transmitted photons are scattered as a result of Rayleigh-scattering from air molecules and Mie-scattering from air-borne particles and pollutants. The receiver optics, typically located below the beam (or thereabout), collects some of the scattered photons and retrieves the transmitted data. Controlling the laser output power and angle changes the coverage area. By slanting the laser beam as shown in FIG. 1(b) one can provide sector-like coverage similar to a cellular system. Multiple laser-frequencies are used to add more bandwidth or serve more customers from each base station. The technology can be engineered to provide high-quality service levels in various climates and under fog, rain and snow conditions. FIG. 1(c) shows a typical configuration within a city topology where a horizontal beam is used down street. The beam propagates almost parallel to the ground. The receivers are located in the buildings; they receive the scattered beams on both sides of the street. The users may be located at the same level as the data transmitting beam, and also above and below this level. This configuration is useful in large cities were no clear view to the sky exist. Further topologies for high rising rooftops were defined for various coverage situations to maintain a variety of optimal implementations.

The key scientific and engineering problem of scattered optical communications is that a transmitted bit spans over a distance and travels along the beam at the speed of light (0.3 m/1 nsec). For a 100 Mbit/s each bit lasts 10 nsec and spans 3 m. An optical aperture at the receiver will see 100 bits if imaging 300 m of the beam. To avoid this problem one can reduce the rate to 1 Mbit/s, when a bit spans 300 m, and compensate for the different arrival time by a linear sensing array followed by a digital spatial de-convolution. This solves the multipath problem by reducing the rate while preserving the link budget. However this system cannot operate at a high speed required for multiple applications such as high definition TV, high speed internet and a combination of thereof.

This present invention uses OFDM (Orthogonal Frequency Division Multiplexing) technique to achieve high bit rate transmission over a NLOS communication link. In optical OFDM each channel the optical carrier is directly modulated by a complex RF signal that can be construed as a linear combination of M separate digitally modulated RF signals at frequencies $f_m$ such that $f_m=m/T$ where T is the period of modulation. Thus the total symbol rate of the transmitted information is M/T. In the text we shall refer to the frequencies $f_m$ as "sub-carriers".

Figure 2:
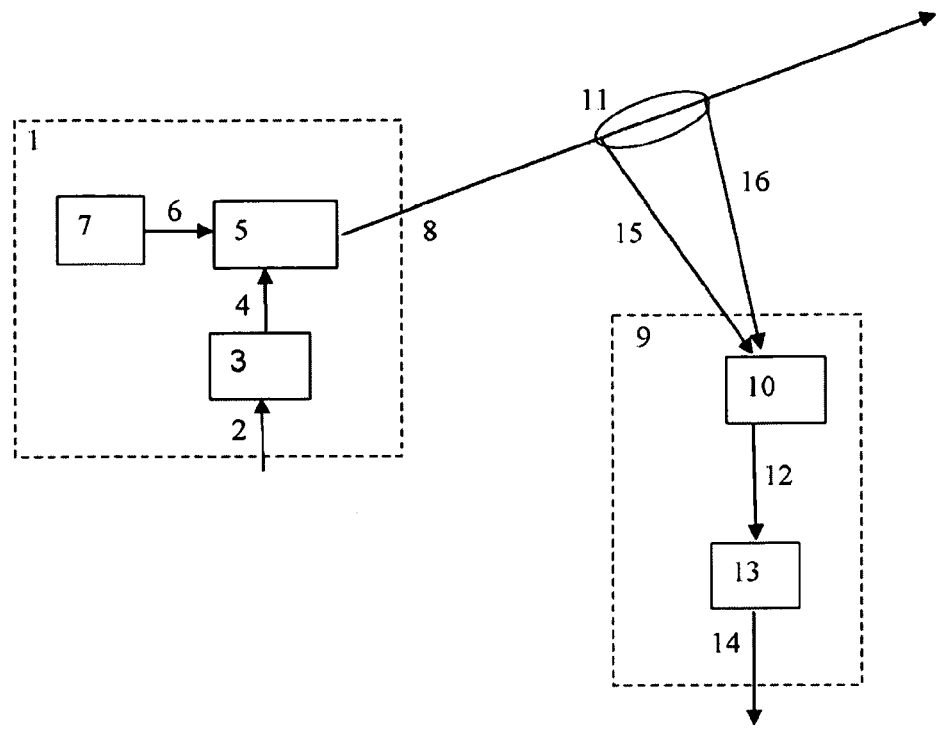
FIG. 2 A block diagram of the non-line of sight communications system.
Figure 3:
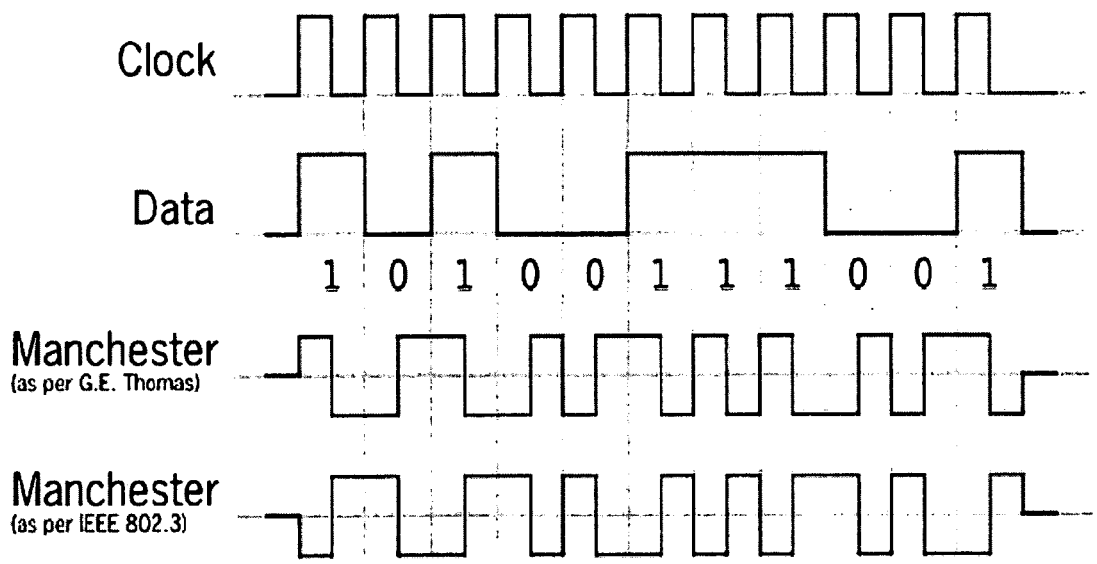
FIG. 3. Illustration of Manchester coding.

FIG. 2 shows a block diagram of non-line of sight communication system, which uses OFDM technique to encode modulated data. In the preferred embodiment the initial beam transmits data using Manchester coding as shown in FIG. 3. However other modulation formats such as amplitude modulation, phase modulation, frequency modulation, etc. are applicable. In a transmitter 1 a digital data stream 2 enters an OFDM encoder 3, which outputs analog signal 4 driving an optical modulator 5. The modulator 5 embeds the modulation in a light beam 6 emitted by a light source 7. In one of the embodiments the light source generates pulsed ultraviolet light in the range from 200 to 280 nm. Laser AVIA 266-3 from Coherent, Inc. located in Santa Clara, Calif. can be used as a light source. Output optical signal 8 from the modulators 5 is transmitted skywards. A receiver 9 includes an array of photodetectors 10. The photodetector array will be discussed in more details below. The function of the detector system is to collect light being scattered along the initial beam propagation direction and to convert the light into electrical signals. The photodetector system collects light from the area 11 along the light beam 8. The photodetector system 10 outputs electrical signal (or signals) 12, which impinge digital signal processing unit (DSP) 13. Output recovered data stream 14 can be displayed or used for further processing.

Figure 4:
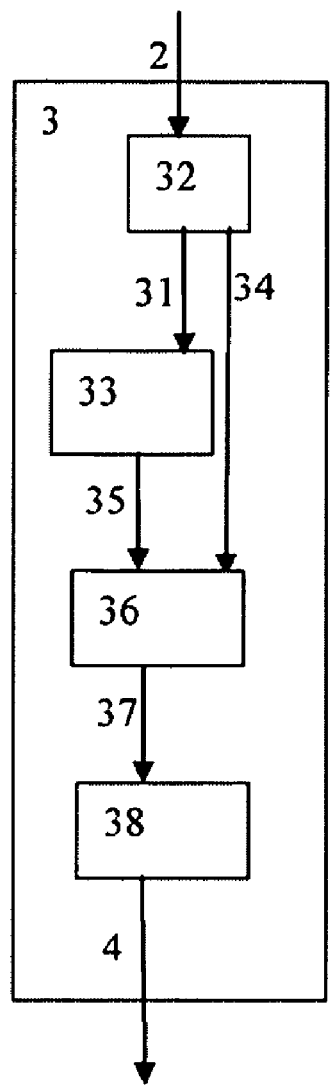
FIG. 4. Detailed schematics of the OFDM block.

FIG. 4 shows an embodiment of the OFDM encoder 3. A serial data stream 2 is converted into parallel sub-carrier data streams 31 in a serial-to-parallel converter 32. In OFDM, the sub-carrier frequencies are chosen so that the sub-carriers are orthogonal to each other, meaning that cross-talk between the sub-carrier channels is eliminated and inter-sub-carrier guard bands are not required. Output signal 31 enters a data encoder 33, which is an ASK data encoder in the preferred embodiment. One or more sub-carrier frequencies are used as pilot tones 34 without data. Then an Inverse Fast Fourier Transform is applied in an IFFT unit 36 to the data and pilot channels. A digital output signal 37 is converted to the analog signal in a D/A converter 38. The analog signal 4 is applied to an optical modulator 5 as shown in FIG. 2. In the preferred embodiment the modulator 5 is a MZI electro-optic modulator.

Sub-carrier frequencies exist only in digital domain, therefore data transmission in OFDM communications is different from wavelength division multiplexing, where each light beam has its own optical frequency.

Each channel 8 in the preferred embodiment transmits up to 100 Mbit/s, where data is spread over 100 sub-channels, each carrying 1 Mbit/s rate, All of the sub-channels do not physically exist; they are created in digital domain. Sub-carrier signals are generated using an IFFT (Inverse Fast Fourier Transform) in OFDM unit 3. Now every bit in the channel spans physically 300 m, but on a different frequency bin. The receiver performs a FFT to separate sub-carriers. Additionally the receiver performs a spatial de-convolution that is common to all sub-carriers and is described below.

Figure 5:
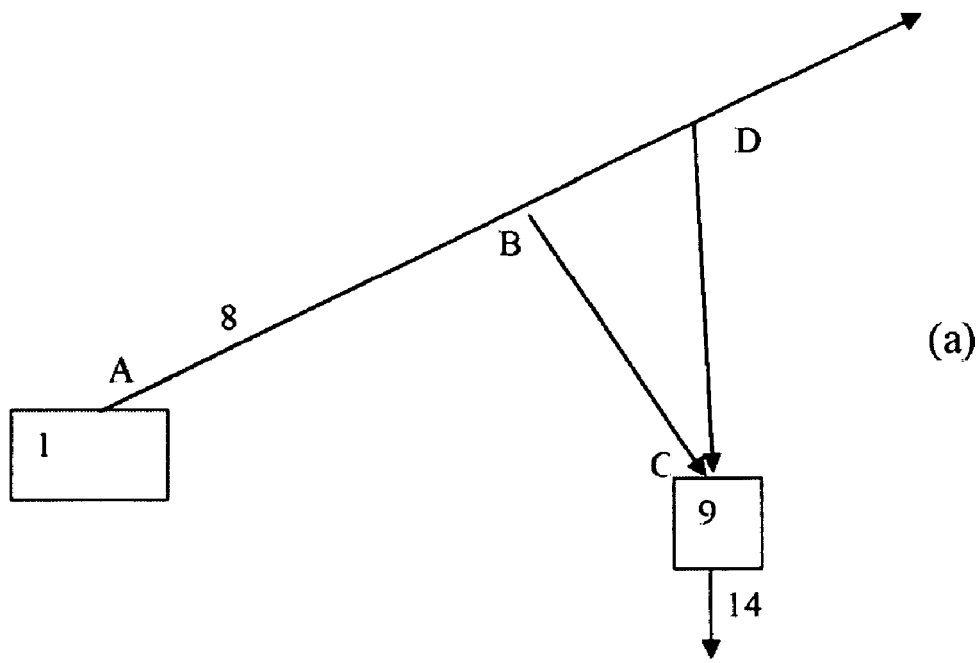
FIG. 5. Pulse smearing in non-line of sight communication system due to the difference in light propagation distance.

The present invention further provides compensation for the pulse smearing, which occurs in scattering communication links. FIG. 5 illustrates a signal pulse propagation and multipath scattering. The detector 9 detects radiation scattered from all points between B and D along the beam 8 propagation line. The optical path ABC is much shorter than ADC, and this causes spatial pulse stretching at the receiver. To overcome this problem, it was proposed to compensate the difference in the signal arrival time in the digital processing unit 13 (FIG. 1) inside the receiver 9. In OFDM system such compensation is performed for each sub-carrier in digital domain by the sub-carrier signal phase multiplication by a term being proportional to the distance from the light source to the receiver 9.

Figure 6:
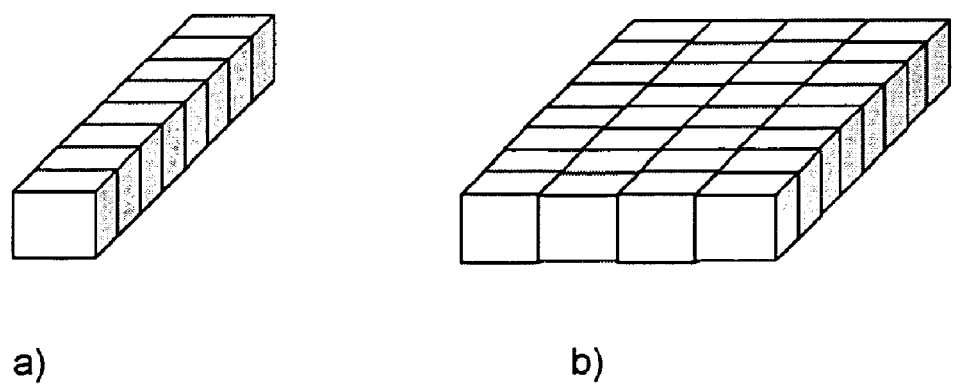
FIG. 6. (a) A linear array of photodetectors, and (b) a two-dimensional arrangement of detectors.

The array of the photodetectors may be one-dimensional as shown in FIG. 6(a). In the preferred embodiment a two-dimensional arrangement is used as shown in FIG. 6(b). In the preferred embodiment the photodetectors are GaN photodetectors as described below. In another embodiment the photodetectors are avalanche diodes as described in US Patent Application No. 20050098844 by Sandvik, incorporated herein by reference. Alternatively any other type of solid state photodetector, semiconductor photodetector or photomultiplier can be used. Hamamatsu R928 Photomultiplier with a UV filter was used in the experimental testing of the present invention.

Figure 7:
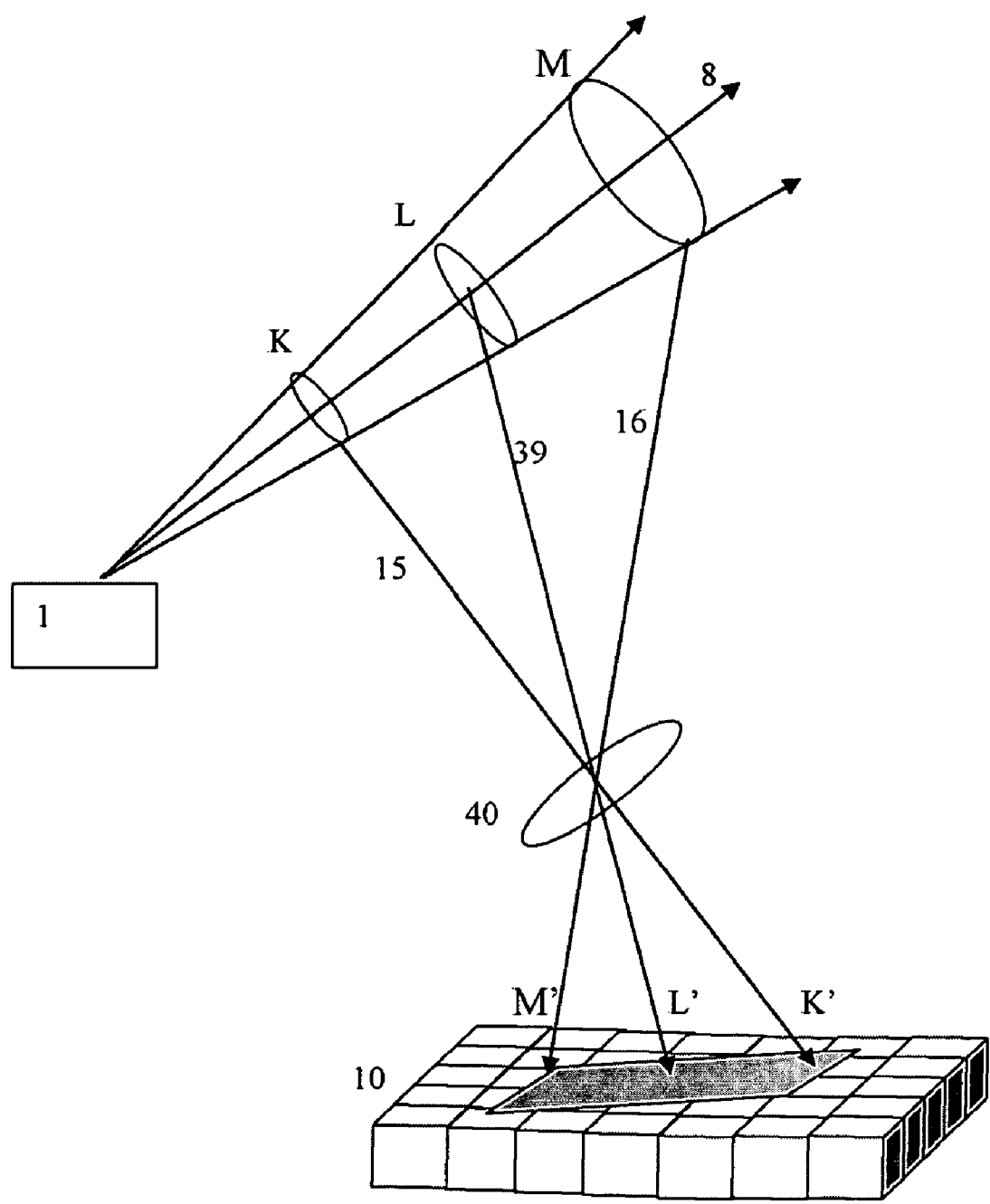
FIG. 7. An optical scheme illustrating light projection on the two-dimensional photodetector.

FIG. 7 shows schematically how the scattered light 15, 16 is projected by an optical system 40 onto the two-dimensional detector array 10. Two-dimensional arrangement allows focusing of the beam without precise adjustment of the detector position relative to the beam direction. It also allows continuously receiving the signal if the position of beam 8 changes with time. The position of the image M'L'K' of the space area MLK occupies a large number of individual photodetectors. The image will move in the plane of the photodetector array 10 if the beam 8 changes its propagation direction. The use of two-dimensional detector array allows flexibility of the communication set up arrangement, its ability to adjust to changing conditions and improved reliability, since the signal does not get lost if the slight changes in the setup schematics occur.

Figure 8:
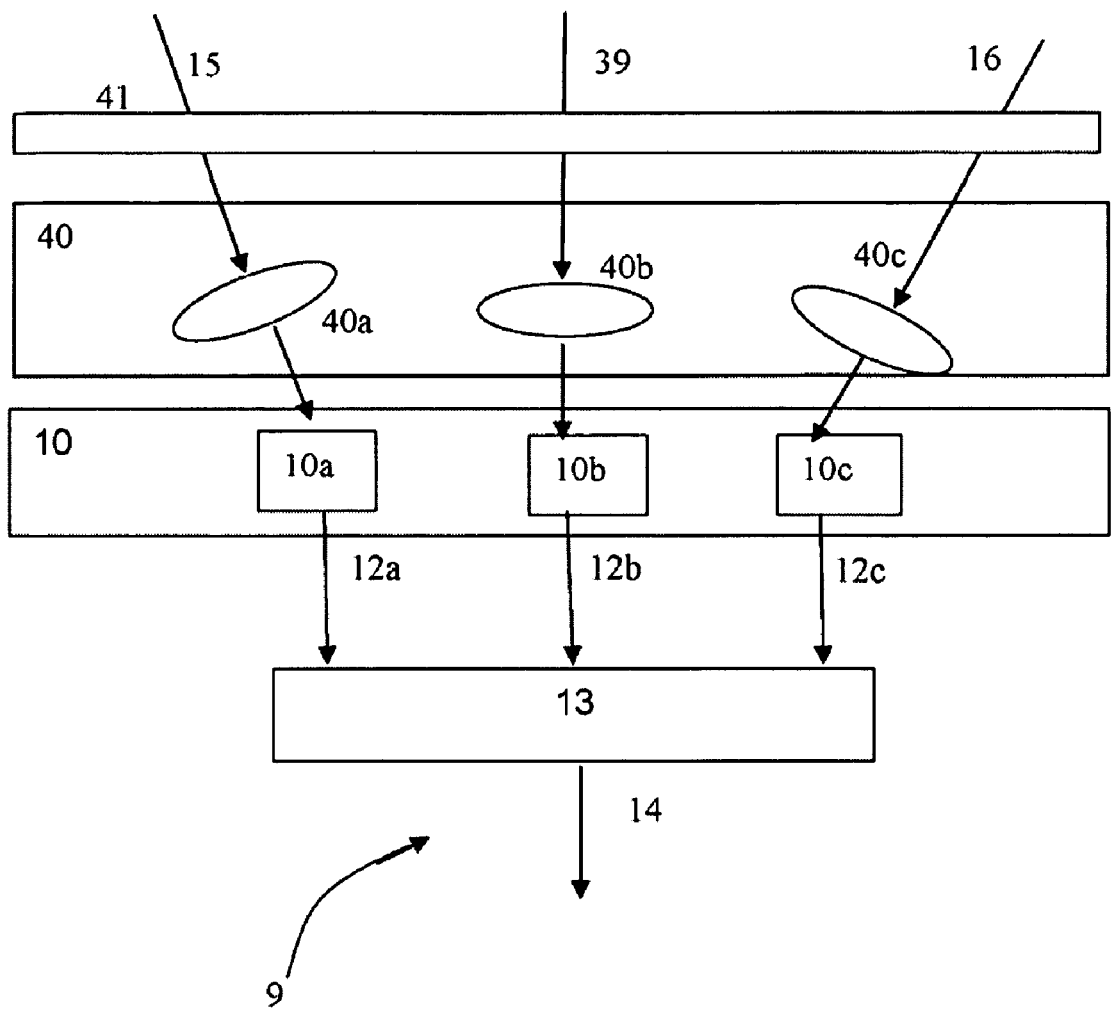
FIG. 8. A block diagram of the receiver according to one of the embodiments of the present invention.

In the preferred embodiment the receiver 9 includes focusing element. It may be a multiple aperture element 40 as shown in FIG. 8, which comprises a set of optical elements 40a-40c. Collective optics is an important part of the receiver which allows to gather more energy on the photodetectors and to increase the system sensitivity. Output electric signals 12a, 12b and 12c enter the DSP unit 13 for data processing, information recovery and results displaying.

Optionally the receiver 3 may include a filter or a set of filters 41 to select a particular wavelength range from incoming radiation. The filter 41 may serve as a shield from ambient light. Alternatively, when the initial beam is a wavelength division multiplexed (WDM) beam, the filter 41 may select a particular wavelength out of WDM signal.

Figure 9:
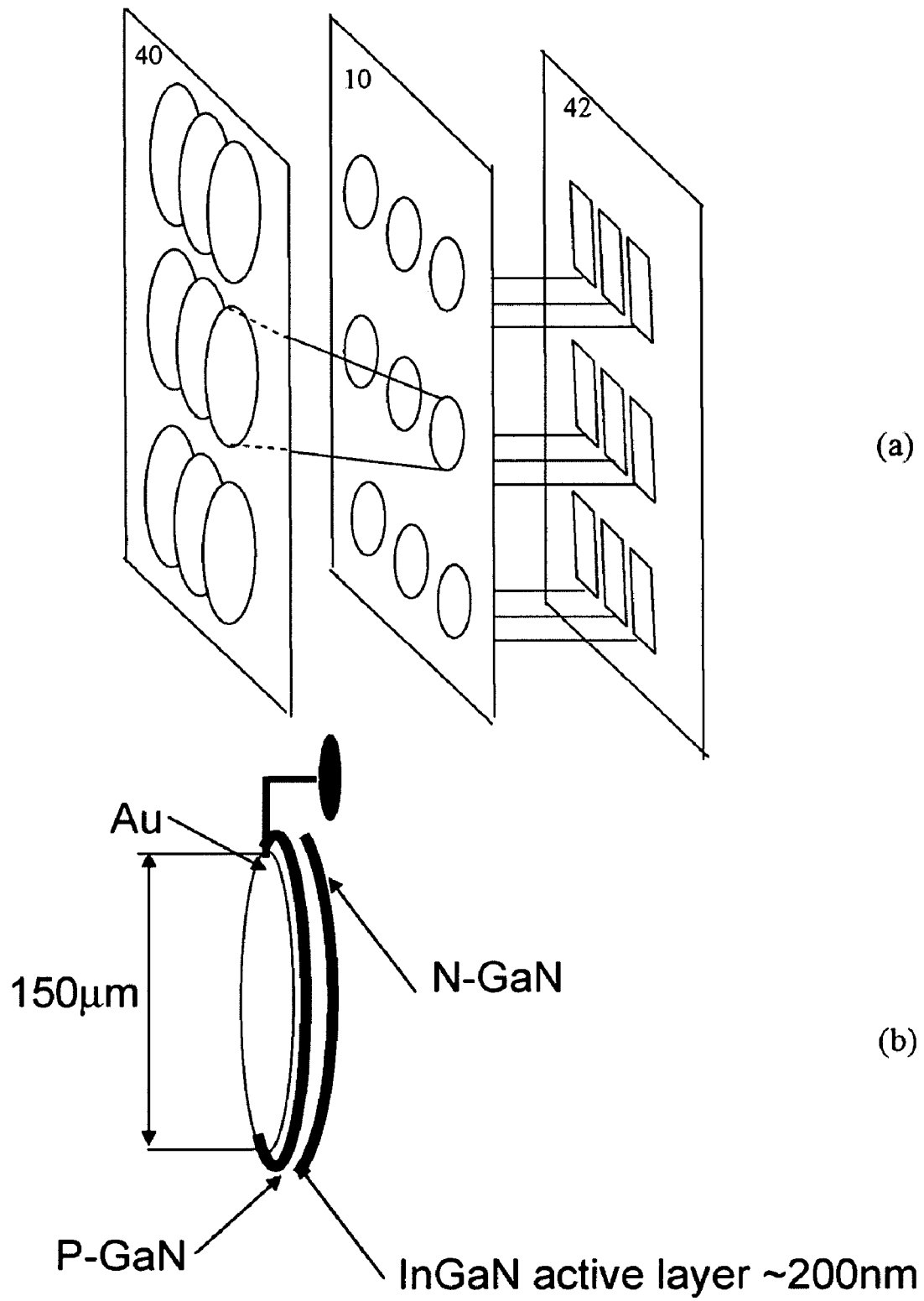
FIG. 9 (a) Optical scheme illustrating light collecting on the photodetector array with two-dimensional array of microlenses, (b) the photodetector structure.

A part of the receiver, which is a combination of the two-dimensional array of lenses 40, photodetectors 10 and electronic circuits 42 is shown in FIG. 9(a). The detector focal plane array 10 consists of M×N semiconductor UV-visible detectors, it is shown in more details in FIG. 8(b). In the preferred embodiment the detector diameter is about 150 micron. Each detector is essentially a heterojunction photodiode based on GaN and it alloys: $In_xGa_{1-x}N$ and $Al_xGa_{1-x}N$. The active layer is made by InGaN deposition with the layer thickness of several hundreds of nanometers. In the preferred embodiment it is 200 nm. The active layer is covered by GaN layers and Au thin film. The composition of the central layer of the materials is chosen to absorb the laser radiation. The inner layer thus absorbs the radiation and the outer layers provide ohmic constacts. Au layer is used to provide one contact while the second contact is provided via substrate. The two-dimensional matrix of detectors is necessary in order to capture the whole image of the light column that may be tilted in relation to the detector and thus avoiding necessity of rotating the detector mechanically. Each detector is connected to its own amplifier on a separate signal processing chip. The electronic circuits system 42 is an integrated Si circuitry.

Figure 10:
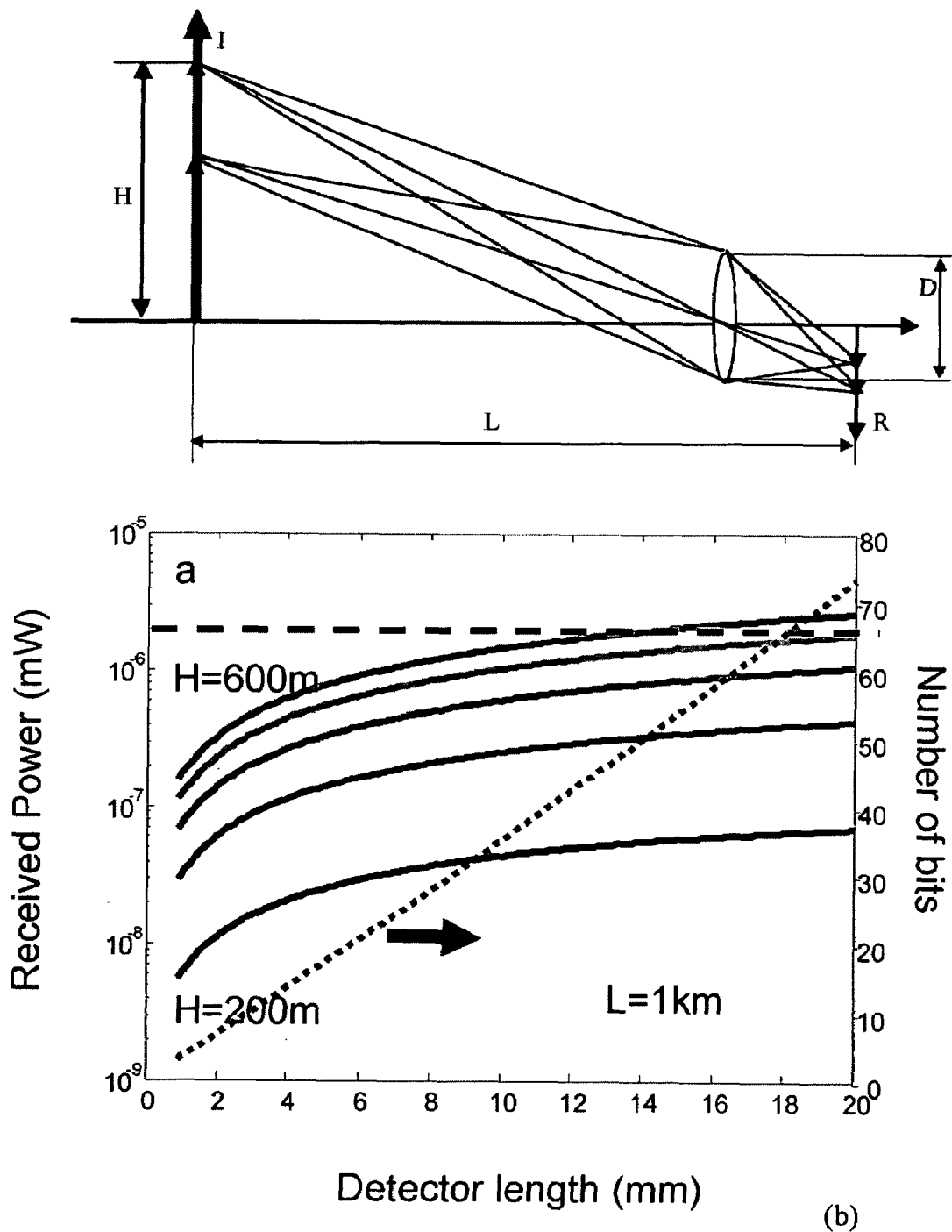
FIG. 10 (a) Optical scheme illustrating image formation by an optical lens with vertical transmitting configuration as shown in FIG. 1(a); (b) System performance for data transmission over L=1 km: the number of received bits depends on the received power and the height of the light scattering point in vertical transmitting configuration.

The size of photodetector array 10 is critical. With a goal of system miniaturization, the detector at the same time must receive a sufficient signal power for the data recovery. Number of scattered photons decreases along the initial beam propagation. FIG. 10 shows the dependence of required photodetector array size on the distance. FIG. 10(a) shows the system geometry, where H is the penetration depth or the height of the light scattering point. L is the distance between vertical initial beam I and receiver R. FIG. 10(b) demonstrates that for L=1 km we can get sufficient signal at the detector only if the penetration depth, H is as high as 600 m and the length of the detector should be at least 12 mm. Dashed line is required received power for error-free detection. Dotted line is the number of signal bits collected by the detector.

Figure 11:
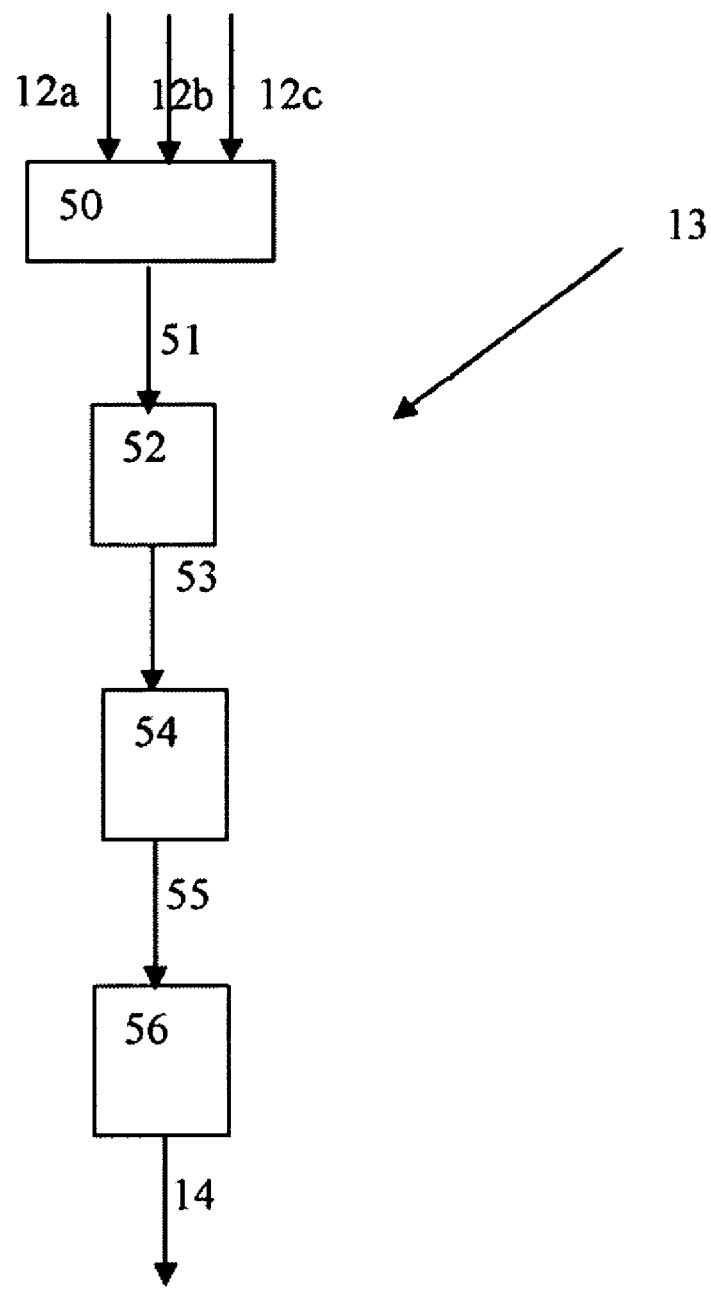
FIG. 11 An block diagram of an OFDM unit at the receiver for the transmitted data recovery.

The DSP unit 13 is shown in more details in FIG. 11. The sets of signals 12a-12c are digitized in A/D converter 50 and then split into parallel data values in serial-to-parallel unit 52. The obtained signal 53 is used as an input to the FFT unit 54, which generates the data symbol streams 55. The data is decoded from the signals 55 in a decoding unit 56, which outputs data signal 14 for further processing or display.

Figure 12:
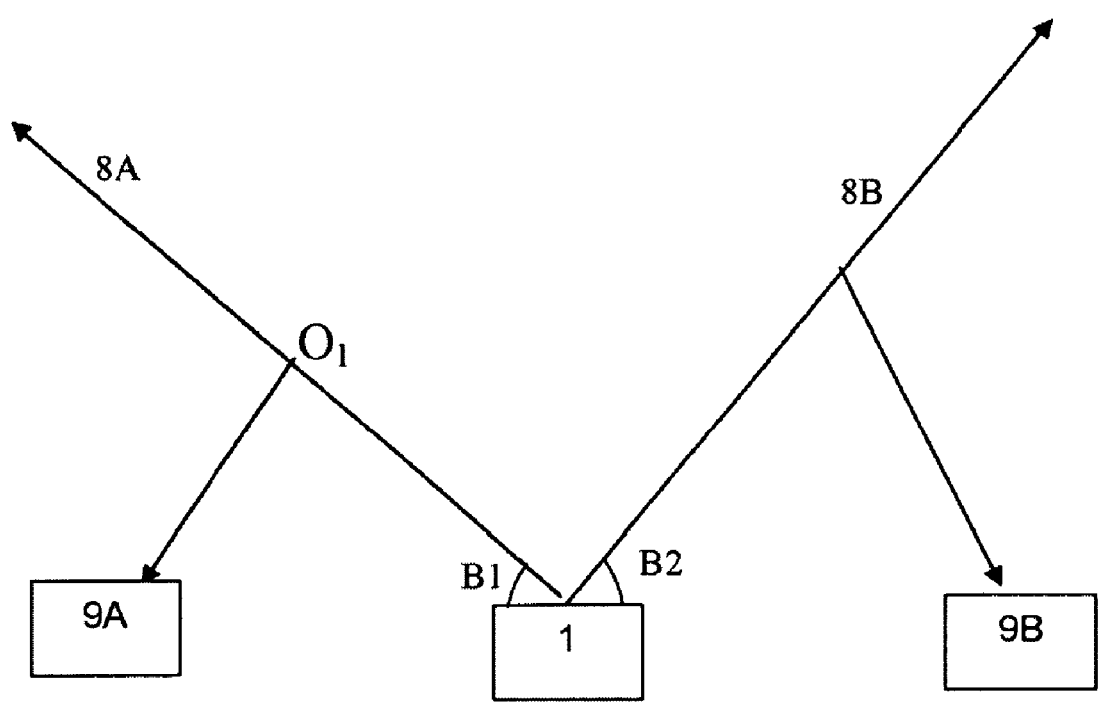
FIG. 12 A block diagram of non-line of sight communications system with an initial beam split into two beams directed along the different azimuths and having different elevation angles.

In one embodiment of the invention the initial optical beam consists of series of optical beams, each directed along its azimuth and has its own elevation angle. FIG. 12 shows the initial beam being split into two secondary initial beams 8A and 8B. The first part of the initial optical beam 8A is directed along an azimuth A1 towards the sky at an elevation angle B1 above the horizon. The light beam 8A is scattered on the atmosphere inhomogeneities in a free space along its transmission path, portions of the initial optical beam forming scattered light and received by a receiver 9A. Another part of the initial beam 8B transmits information in the similar manner, and this information is detected and recovered by a receiver 9B. In general case, the initial beam can be split in any number of secondary initial beams, each of them carrying independent information. The information transmission along each direction can be a WDM transmission with a number of frequency separated channels.

The foregoing description of a preferred embodiment of the invention has been presented for purposes of illustration and description. It is not intended to be exhaustive or to limit the invention to the precise form disclosed, and obviously many modifications and variations are possible in the light of the above teaching. The described embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An optical communications system, comprising:
   a laser light source, the laser light source outputting an initial optical beam;

a data generator, producing a digital data stream converted into M parallel frequency sub-carrier digital data streams, where M is an integer, each sub-carrier is encoded with data, then an Inverse Fast Fourier Transform operation is applied to all sub-carrier data streams, an output signal is converted to an analog signal in a D/A converter, the analog signal is imposed onto the initial optical beam;

a beam forming unit transmits the beam with imposed data skywards at an elevation angle above the horizon in at least one direction;

the beam with imposed data being scattered due to Mie and Raleigh effects inside a free-space volume along the beam transmission path, forming a scattered waveform;

at least a part of the scattered waveform is received by a receiver, the receiver includes a photodetector receiving optical beam and outputting an electrical signal;

the electrical signal enters a digital signal processing unit, the DSP unit digitizing the electrical signal, performing Fourier transformation and recovering data from M sub-carrier signals.

2. An optical communications system according to claim 1, wherein the receiver is positioned aside from the initial optical beam creating a non-line of sight communication system.

3. An optical communications system according to claim 1, wherein the beam forming unit transmits the beam with imposed data in urban environment almost parallel to the ground.

4. An optical communications system according to claim 1, wherein a data modulation format uses Manchester coding.

5. An optical communications system according to claim 1, further comprising:
at least one optical element receiving the scattered waveform, collecting and focusing the waveform on the photodetector.

6. An optical communications system according to claim 1, wherein the receiver includes a two-dimensional matrix of photodetectors.

7. An optical communications system according to claim 1, further comprising a two-dimensional system of microlenses to focus the scattered waveforms on the photodetectors.

8. An optical communications system according to claim 7, wherein the system of microlenses forms an image of the free-space volume in the plane of photodetectors, and the image is larger than one photodetector, and a DSP unit processes signals from all photodetectors, on which the image of the free-space volume is projected.

9. An optical communications system according to claim 1, wherein a DSP unit processing includes multiplying each sub-carrier digital signal phase by a term being proportional to the distance from the light source to the receiver.

10. An optical communications system according to claim 1, where M is from 10 to 100.

11. An optical communications system according to claim 1, where each sub-digital-carrier has a data rate of at least 1 Mb/s.

12. An optical communications system according to claim 1, where each sub-digital carrier has a data rate of at least 100 Mb/s.

13. An optical communications system according to claim 1, wherein the initial optical beam has a wavelength in the range from 200 nm to 280 nm.

14. An optical communications system according to claim 1, wherein the photodetector is an InGaN/GaN devices.

15. An optical communications system according to claim 1, wherein the photodetector is a solid state device.

16. An optical communications system according to claim 1, wherein the photodetector is at least 12 mm long.

17. An optical communications system according to claim 1, further comprising the optical beam having multiple wavelengths.

18. A method of optical communications, comprising:
emitting an initial light beam;
converting a digital data stream into M parallel sub-carrier data streams, where M is integer, encoding each sub-carrier with data, applying an Inverse Fast Fourier Transform operation, and converting to an analog signal in a D/A converter;
modulating the initial light beam with the analog signal;
directing the beam with data skywards;
scattering the beam with data along its transmission path and forming a scattered light;
receiving at least a first portion of the scattered light on a first photodetector, digitizing a first signal from the first photodetector, performing Fourier transformation to it and recovering data from M sub-carrier signals, wherein the communications is non-line of sight communications.

19. A method of optical communications according to claim 18, wherein the communications is bi-directional communications.

* * * * *